(12) United States Patent
Elian et al.

(10) Patent No.: US 10,519,030 B2
(45) Date of Patent: Dec. 31, 2019

(54) TRANSDUCER PACKAGE WITH INTEGRATED SEALING

(71) Applicant: Infineon Technologies AG, Neubiberg (DE)

(72) Inventors: Klaus Elian, Alteglofsheim (DE); Franz Gabler, Lappersdorf (DE); Thomas Mueller, Lappersdorf (DE); Horst Theuss, Wenzenbach (DE); Mathias Vaupel, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/478,946

(22) Filed: Apr. 4, 2017

(65) Prior Publication Data
US 2017/0283246 A1 Oct. 5, 2017

(30) Foreign Application Priority Data
Apr. 4, 2016 (DE) .................. 10 2016 106 122

(51) Int. Cl.
*B81B 7/00* (2006.01)
*B81C 1/00* (2006.01)

(52) U.S. Cl.
CPC .......... *B81B 7/0035* (2013.01); *B81B 7/0061* (2013.01); *B81C 1/00277* (2013.01); *B81B 2201/0257* (2013.01); *B81C 2203/019* (2013.01); *H01L 2224/16225* (2013.01); *H01L 2224/48145* (2013.01); *H01L 2224/73265* (2013.01); *H01L 2224/8592* (2013.01)

(58) Field of Classification Search
CPC ... H01L 2224/48091; H01L 2924/1461; H01L 21/56; H01L 2224/16225; H01L 2224/48145; H01L 2224/73265; H01L 2224/8592; B81C 1/00277; B81C 2203/01; B81C 2203/0172; B81C 2203/019; B81B 7/0035; B81B 7/0032; B81B 7/0061; B81B 2201/0257
See application file for complete search history.

(56) References Cited

U.S. PATENT DOCUMENTS

| | | | |
|---|---|---|---|
| 7,145,253 B1 * | 12/2006 | Kim | B81C 1/00333 257/790 |
| 2002/0135992 A1 | 9/2002 | Kuroda | |
| 2013/0140655 A1 * | 6/2013 | Yeh | H01L 21/56 257/416 |
| 2013/0140656 A1 * | 6/2013 | Pahl | B81B 7/0061 257/416 |
| 2014/0064546 A1 * | 3/2014 | Szczech | H04R 1/04 381/361 |
| 2014/0103463 A1 | 4/2014 | Winkler et al. | |
| 2015/0090042 A1 * | 4/2015 | Vaupel | B81B 7/0048 73/725 |

FOREIGN PATENT DOCUMENTS

DE 10205127 A1 8/2003
WO 2004106222 A1 12/2004

* cited by examiner

*Primary Examiner* — Jasmine J Clark

(57) ABSTRACT

A package which comprises a carrier, a transducer mounted on the carrier and configured for converting between a package-external property and an electric signal, a package housing at least partially housing at least one of the carrier and the transducer, and a sealing which forms at least part of the package housing for sealing between the package and a package-external body.

14 Claims, 2 Drawing Sheets

//TRANSDUCER PACKAGE WITH
INTEGRATED SEALING

BACKGROUND OF THE INVENTION

Field of the Invention

The present invention relates to a package, to an electronic device, and to a method of manufacturing an electronic device.

Description of the Related Art

Silicon microphones may be manufactured from a solid block of crystalline silicon material which, by applying techniques such as etching and using sacrificial layers, is processed so as to form two opposing membranes on the annular block which are connected with metallic electrodes. In the presence of acoustic waves, the membranes move, thereby changing the capacitance of the membrane-electrode arrangement which can be measured electrically via an electric signal between the electrodes. Such silicon microphones can be mounted together with a logic chip in a semiconductor device casing having an inlet or port for the acoustic waves.

A similar structure may be used as air pressure sensor, which can be based on a pressure sensor chip assembled in a cavity package. In some applications, the pressure sensor has to be assembled in the system with help of air tight sealings.

Conventionally, such a sealing is provided as separate sealing ring. Handling of such a sealing ring and of a package during mounting such components in a device casing may be cumbersome.

SUMMARY OF THE INVENTION

There may be a need for a transducer package being simple and compact in construction and user-friendly during assembly.

According to an exemplary embodiment, a package is provided which comprises a carrier, a transducer mounted on the carrier and configured for converting between a package-external property (such as a pressure, an acoustic wave, an atmosphere, electromagnetic radiation) and an electric signal, a package housing at least partially housing at least one of the carrier and the transducer, and a sealing (in particular for sealing between the package and a package-external body such as a casing of an electronic device) which forms at least part of the package housing.

According to another exemplary embodiment, an electronic device is provided which comprises a device casing having a port (for instance a port via which a package-external property may be brought in functional cooperation with a transducer in the electronic device), and a package (in particular a package having the above-mentioned features, for instance a semiconductor package) comprising a transducer (such as a sensor) and a package-integrated sealing, wherein the package is mounted in the device casing so that the transducer is coupled with an exterior of the device casing via the port and so that the sealing fluidically decouples an interior of the device casing with regard to the port.

According to yet another exemplary embodiment, a method of manufacturing a package is provided, wherein the method comprises providing a transducer configured for converting between a package-external property and an electric signal, at least partially housing the transducer by a package housing, and forming a sealing (in particular for sealing between the package and a package-external body) as at least part of the package housing.

According to an exemplary embodiment of the invention, a transducer package is provided in which a package housing for at least partially encapsulating or surrounding a transducer and/or a transducer carrier is simultaneously configured as a sealing element. Such a sealing element may in particular seal between an interior and an exterior of an electronic device when the package is mounted on and/or in the electronic device. Since the transducer, when mounted in the electronic device, advantageously requires functional coupling with a device external atmosphere for properly carrying out its transducer function, there may be the requirement to provide a through-hole or any other kind of port in a device casing of the electronic device. This however involves the risk that undesired material, in particular a liquid, enters the electronic device via the port. By providing an integrated sealing with the transducer package, a corresponding fluid-tight electronic device may be provided. By not providing a sealing element as a separate member, but in contrast to this forming integral part of the package housing, a compact package and a lightweight configuration may be obtained. Handling of many parts during assembly of an electronic device is then dispensable. A gist of an exemplary embodiment of the invention may be seen in that the package is also the sealing.

DESCRIPTION OF FURTHER EXEMPLARY EMBODIMENTS

In the context of the present application, the term "electronic device" may particularly denote any electronic appliance implementing a transducer (in particular an electromechanical or electroacoustic transducer) and at least one further electronic functionality. In particular, it may include any portable device having a capability of converting acoustic waves into electric signal, and/or vice versa.

The term "transducer" may particularly denote any (for example electromechanical or electroacoustic) member capable of generating a secondary electric signal indicative of the content of a primary signal (for example an acoustic wave), such as in case of a microphone. However, the term "transducer" may also denote a (for instance electromechanical or electroacoustic) member generating a secondary (for example acoustic) signal indicative of a content of a primary electric signal, such as in case of a loudspeaker. The transducer, which can be an electroacoustic transducer, may be particularly configured as a microelectromechanical device (MEMS), and may for instance be manufactured in semiconductor technology, particularly in silicon technology. Such a transducer may have one membrane or two opposing and movably mounted membranes connected to electrodes so that, as a result of a change of the capacitance in response to a motion of the membrane(s), an electric signal between the electrodes changes characteristically, or the motion is changed characteristically upon applying an electric signal between the membranes. Also piezoelectric transducers can be implemented in terms of electromechanically transducing. Other kinds of transducers may be implemented as well, for instance electrooptical transducers converting between an optical signal and an electric signal, electrochemical transducers converting between a chemical atmosphere and an electric signal, etc.

The term "semiconductor chip", in particular "control chip", may particularly denote an electronic chip having one or more integrated circuit elements therein. Such a chip may be provided for processing electric signals generated by the transducer in response to a present (in particular acoustic or pressure) signal. However, in another embodiment, the chip may also be configured for generating an electric primary signal having a content which is transformed into a secondary signal (for instance an acoustic signal) by applying the electric signal from the chip to the transducer in terms of a loudspeaker.

The term "carrier" may particularly denote a physical structure which is configured for mounting a transducer, electronic chip and/or electronic member(s). The carrier may be one single physical structure (such as a single printed circuit board) or a plurality of physical structures (such as a first printed circuit board as main board and a second printed circuit board as additional structure to be mounted on or to be provided in addition to the main board). The term "a carrier" covers a single carrier or multiple carriers or carrier portions, which carriers or carrier portions may be connected to one another. Also a leadframe or any other electrically conductive structure may be used as carrier.

The term "package housing" may particularly denote any physical structure providing a housing function on the level of a package, in particular a semiconductor package. This may include a contribution to a mechanical protection of carrier, chip and/or electric circuitry by an encapsulation or by providing a contribution during encapsulating (for instance spatially delimiting an encapsulant). Another package housing function may be the bridging of an interconnect gap, i.e. the translation between the small dimensions of electric connection structures of the semiconductor world to larger dimensions of electric connection structures of the PCB world.

The term "device casing" may particularly denote any physical structure covering or surrounding at least a part of the package and connected to the package by the sealing. One example of such a device casing or cover is a cup-shaped lid member. Another example of such a device casing or cover is a hollow body (or a part thereof) fully surrounding the package and being connected thereto by the sealing. The term "a device casing" covers a single lid or multiple lids or lid portions, but also covers a single device casing (for instance formed by two cooperating members such as two half-shells), multiple device casings or lid-device casing combinations.

The term "fluidic" may particularly denote "related to a fluid", wherein a fluid may be a liquid and/or a gas.

In the following, further exemplary embodiments of the package, the electronic device, and the method will be explained.

In an embodiment, the sealing is configured for fluidically decoupling an interior with regard to an exterior of an electronic device when the package is mounted in the electronic device. This requires adaptation of the dimension and shape of the sealing to the dimension and shape of the device housing.

In an embodiment, the carrier comprises a laminate type structure (such as a printed circuit board), or an electrically conductive structure (such as a lead frame). It is possible that the carrier is either partially or entirely electrically insulating (as in case of a purely dielectric carrier), or purely electrically conductive (as in case of a lead frame which for instance may be made of copper), or partially electrically conductive and partially electrically insulating (such as in case of an interposer or a PCB). Exemplary embodiments of the invention are therefore compatible with very different architectures of carriers. In particular, when the transducer comprises one or more semiconductor chips, the carrier may also be denoted as a chip carrier.

In an embodiment, the transducer comprises a sensor and/or an actuator.

When the transducer is a sensor, the package external property (such as acoustic waves or an external pressure or acceleration) can be sensed and converted into the electric signal by the transducer (for instance in the scenario of a microphone or a pressure sensor). For instance, the sensor may comprise a pressure sensor, an acoustic sensor, a microphone configured for converting an acoustic signal into an electric signal, a gas sensor, an optical sensor, a radar sensor, and/or a camera. However, other kinds of sensors are possible as well.

When the transducer is an actuator, the package external property can be generated by the actuator (for instance a loudspeaker may generate acoustic waves in an exterior volume of the package based on an electric signal provided by or to the transducer). For example, the actuator comprises a loudspeaker configured for converting an electric signal into an acoustic signal. However, other kinds of actuators are possible as well, for instance light emitting devices converting an electric drive signal into an external light signal.

In an embodiment, the transducer comprises at least one semiconductor chip. Such a semiconductor chip may be manufactured, for instance, in silicon technology, gallium arsenide technology or silicon carbide technology. A semiconductor chip may have one active surface or two active surfaces. For example, one or more integrated circuit elements may be integrated in the respective active region of the semiconductor chip. For instance, a transducer may comprise two semiconductor chip, i.e. an actual sensor or actuator on the one hand and, functionally cooperating therewith, a control chip, processor chip or logic chip. It is however also possible that a single semiconductor chip includes both a sensor or actuator function and a signal processing function.

In an embodiment, the transducer is configured as a microelectromechanical system (MEMS). Such a MEMS may be an electronic member with a movable element, such as a membrane or a cantilever, as functional structure. In case of such a MEMS, the package housing of the package and/or the device casing of the electronic device should mechanically protect the movable element of the MEMS against mechanical damage by external mechanical loads.

In an embodiment, the package housing comprises or consists of an elastic material, i.e. a material being reversibly deformable by a force. Thus, the package housing may be made partially or entirely of a material which can be compressed or displaced by moderate external forces. This property can be used advantageously for the sealing function. This property can however also be used advantageously for the transducer function in particular when the transducer comprises a movable element such as a membrane, since such a movable element can freely move particular when its environment is not too stiff. The elastic property of such an encapsulation or package housing, or section thereof, may be synergistically used for forming a sealing section as an integral part of the elastic material.

In an embodiment, the package housing consists of the sealing. In such an embodiment, the entire package housing provides a sealing function, in particular when being implemented in the electronic device. At the same time, the same material may also provide a further housing function, such as an encapsulation.

In an embodiment, the package housing comprises an encapsulant, in particular a mold compound or a dispensed structure, encapsulating at least part of at least one of the transducer and the carrier and being laterally (in particular fully circumferentially) surrounded by the sealing. Apart from fulfilling the sealing function, the package housing portion, in particular elastic package housing portion, may also serve as an encapsulant for one or more of the mentioned elements of the package. It is also possible that such a package housing encapsulates at least part of an electric circuitry within the package housing, for instance one or more bond wires and/or solder connection constituents. Such electric connection elements may be mechanically sensitive and can therefore be simultaneously protected by the integral sealing.

In an embodiment, the sealing has an annular shape. With such a closed ring structure, a fluid-leakage suppressing sealing function can be carried out around a laterally uninterrupted path. The sealing may protrude upwardly and/or downwardly beyond the rest of the package to therefore be capable of spacing the rest of the package with regard to a device casing of the electronic device, etc. This provides an additional mechanical protection function and also allows to properly fulfil the sealing function.

In an embodiment, the sealing extends beyond an edge of the transducer in a vertical direction (i.e. in a main compression direction of the sealing during sealing against the device casing) and/or in a lateral direction (which may be a horizontal direction). The sealing may hence form a lateral and/or vertical end section of the package which contributes both to a spacing function for protecting a rest of the package as well as a sealing function because such protruding sections may be easily brought in contact with a counter surface to be sealed.

In an embodiment, the package is configured as one of a premolded package (see for instance the embodiment of FIG. 1 and FIG. 2), a mold-over-chip package (see for instance the embodiment of FIG. 3), and a WLB package (see for instance the embodiment of FIG. 4). However, the exemplary embodiments of the invention are also compatible with other package architectures.

In an embodiment, the package comprises an electric coupling element, for instance at least one bond wire and/or at least one solder structure, configured for electrically coupling the transducer with the carrier (and/or for coupling different semiconductor chips of the transducer with one another) and extending at least partially within the sealing. Also other kinds of electric coupling elements may be protected by the multiple function package housing.

In an embodiment, the sealing is configured as a fluid tight sealing, in particular as at least one of a watertight sealing and an air tight sealing. In the context of the present application, the term "fluid" may particularly denote a gas and/or a liquid, optionally comprising solid particles.

In an embodiment, the sealing is adhesively joint or in material engagement with a rest of the package housing. In such an embodiment, the material of the sealing and the material of the rest of the package housing intrinsically adhere to one another rather than being separate components being glued to one another or the like.

In an embodiment, at least one of the sealing and a rest of the package housing is made of a compressible material. For instance, the sealing may be made of silicone or rubber. An encapsulant of the package housing may be a gel.

In an embodiment, the sealing forms at least part of an exterior surface of the package housing. In such an embodiment, the sealing performs its sealing function with regard to an environment of the package, and not or at least not only within the package.

In an embodiment, the port is a through hole in the device casing. As an alternative to a through-hole allowing a free propagation of acoustic waves or gases, it is also possible that the port mechanically closes the device casing but nevertheless allows a package external property to influence the transducer within an interior of the electronic device. This is for instance possible when the port is filled with a gas permeable filter (for instance made of a porous material) or the like allowing acoustic waves and/or gas to pass the filter in the port, so as to transfer these acoustic waves and gas also into an interior of the electronic device. The port may also be an optically transparent port allowing light to propagate between an interior and an exterior of the device casing.

In an embodiment, the electronic device is configured as one of the group consisting of a portable user equipment, a mobile phone, a smart phone, a watch, and a tablet. However, other applications are possible as well. For instance, the electronic device may be configured as one of the group consisting of a portable device, a handheld device, a user equipment, a multimedia device, a mobile phone, a smart phone, a tablet computer, a laptop, a digicam, and a personal digital assistant. Exemplary embodiments may be implemented particularly with any kind of handheld devices, but can be also applied to other electronic devices such as monitors or TV sets.

In an embodiment, the electronic device comprises a mounting base on which a carrier of the package is mounted, in particular with which the carrier is electrically connected. For example, such a mounting base may be a component board such as a printed circuit board (PCB). However, alternatives for the mounting base are possible such as a flex board, a ceramic substrate, or any other suitable electronic mounting base.

In an embodiment, the sealing is configured for sealing by being pressed between the device casing and a carrier of the package. Thus, the sealing function may be accomplished merely by compressing the sealing between the device casing and the carrier.

In an embodiment, the sealing is provided or formed by one of the group consisting of molding, dispensing, vulcanizing, and pick-and-place assembling the sealing. However, other manufacturing techniques such as depositing or laminating are possible as well for manufacturing the sealing portion of the package housing.

In an embodiment, the method further comprises mounting the package in a device casing of the electronic device so that the transducer is functionally coupled with an exterior of the device casing via a port in the device casing and so that the sealing seals between an interior of the device casing and the port. However, the sealing may also be used for other sealing purposes.

In an embodiment, the electromechanical or electroacoustic transducer is a microelectromechanical system (MEMS). In such an embodiment, it is for instance possible that a support structure (particularly shaped as a hollow tube or annulus) for polysilicon membranes is formed by crystalline silicon. Metallic electrodes may be connected to the membranes so that mutual motion of the membranes in response to sound to be detected causes a change of the capacitance of the described structure which is electrically detectable via the electrodes. However, other constitutions of the transducer can be implemented according to other exemplary embodiments as well, for instance using a piezoelectric microphone. The thickness of the membranes may be less than 1 µm, for instance may be 300 nm or 800 nm. The electrodes may be manufactured from gold. A height of the electroacoustic transducer may be less than 1 mm, for instance not more than 800 µm. Air channels in the membranes may provide for a certain pressure equilibration between the spaces on both opposing sides of the membranes. Furthermore, an adhesive which may be used for connecting the transducer to the carrier may generate gases which may be removed out of the back volume via the air channels.

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings.

DETAILED DESCRIPTION OF EXEMPLARY EMBODIMENTS

Figure 1:
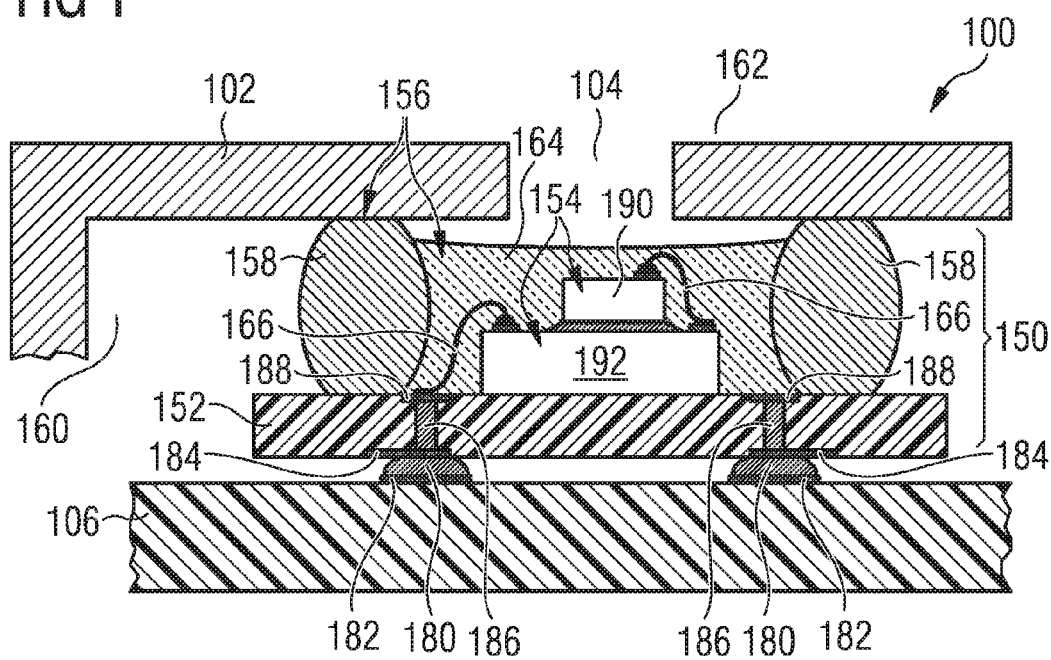
FIG. 1 illustrates a cross-section of an electronic device according to an exemplary embodiment.

The illustration in the drawing is schematically and not to scale.

Before exemplary embodiments will be described in more detail referring to the figures, some general considerations will be summarized based on which exemplary embodiments have been developed.

According to an exemplary embodiment of the invention, a sensor package assembly with integrated sealing function is provided. Such an embodiment enables an air-tight or water-proof assembly of a sensor package to a second level housing (such as a device casing of an electronic device like a smart phone). Hence, an example for an electronic device which can be equipped advantageously with a package according to an exemplary embodiment of the invention is a waterproof smartphone, which has one or more openings for sensors, loudspeaker and microphone which let the signal in and out, but not water.

Conventionally, additional sealing parts are used for such electronic devices which can be placed between the device casing of the electronic device and a counter surface. A typical sealing part which can be used conventionally is a separate O-ring. However, it is conventionally cumbersome to assemble and handle an additional component in form of such an O-ring.

According to an exemplary embodiment of the invention, the implementation of an additional sealing part can be omitted. In contrast to this, the sealing function is already integrated in a package according to an exemplary embodiment of the invention. This renders manufacture, handling and assembly of an additional sealing component dispensable and results in a compact overall structure of the electronic device as a consequence of the provision of a package with integrated sealing functionality.

A gist of an exemplary embodiment of the invention is the provision of a transducer, more specifically a sensor (such as a pressure sensor, gas sensor, optical sensor, radar sensor, camera, etc.), comprising one or more chips on a multilayer substrate or leadframe, housed in an elastic cavity package and covered with a device casing or cover, which may be part of a second level system, i.e. an electronic device such as a mobile phone.

Advantageously, the sealing may already be the sensor package housing. In other words, a package according to an exemplary embodiment of the invention offers, besides the transducer (in particular sensing) function, additionally already the sealing function without the need to handle and assemble a separate sealing part. Additionally, it is possible with exemplary embodiments to use the device casing of the electronic device as counterpart for the package.

One exemplary field of applications of exemplary embodiments of the invention are watches for outdoor use with barometric air pressure sensors on the one hand and additional submarine use up to 300 m water deepness.

In one embodiment, an elastic cavity package is provided, which offers an integrated sealing function. A package according to an exemplary embodiment may be configured as a premolded package (see for instance FIG. 1 and FIG. 2 described below in further detail).

More specifically, a pressure sensor may be provided which comprises or consists of one or more chips (for example a sensor and a processor), a multilayer substrate or leadframe, a soft/elastic cavity package housing, optionally protection gel, and a cover (i.e. device casing of an electronic device such as phone, watch, or supersystem).

In another embodiment, the package may be configured as a regular molded package, for instance manufactured in a mold over chip architecture (see for instance FIG. 3 described below in further detail).

Figure 2:
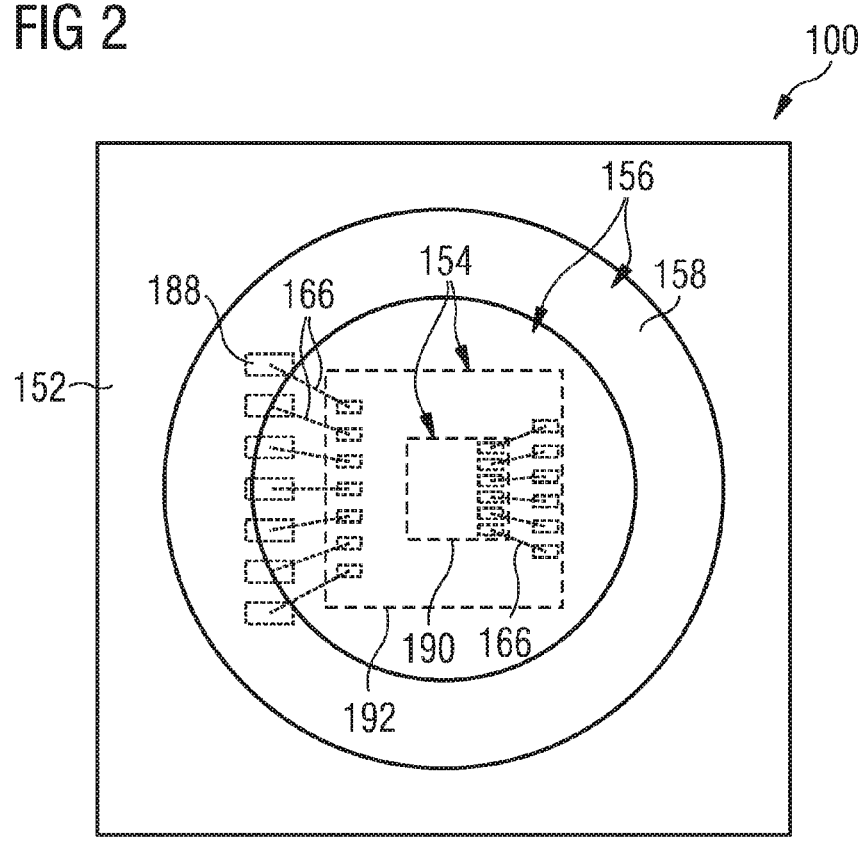
FIG. 2 illustrates a plan view of the electronic device according to FIG. 1.

FIG. 1 illustrates a cross-section of an electronic device 100 according to an exemplary embodiment. FIG. 2 illustrates a plan view of the electronic device 100 according to FIG. 1.

The electronic device 100, here embodied as a mobile phone, comprises an exterior device casing 102 having a gas access port 104 embodied as an open through hole extending through the exterior device casing 102. Furthermore, the electronic device 100 has a package 150 comprising a sensor or transducer 154 assembled in an interior 160 of the exterior device casing 102.

The package 150 comprises a package-integrated annular elastic sealing 158. As can be taken from FIG. 1, the package 150 is mounted in the device casing 102 so that the transducer 154 is pressure-coupled with an exterior 162 of the device casing 102 via the port 104 and via elastic gel of an encapsulant 164. In other words, an external pressure can be transferred via the port 104 and via the pressure-transmitting encapsulant to the transducer 154 for detecting this pressure. The mounting of the package 150 in (or alternatively on) the device casing 102 is such that the sealing 158 seals or fluidically decouples the interior 160 of the device casing 102 with regard to the exterior 162 being in fluid communication and pressure exchange with the port 104. In other words, the sealing 158 seals between the package 150 (more specifically carrier 152 thereof) on the one hand and a package-external body (more specifically the device casing 102 of the electronic device 100) on the other hand. Thus, in particular no liquids such as water or moisture may flow from the exterior 162 to the interior 160 due to the waterproof function of the sealing 158. The sealing 158 is hence configured for fluidically decoupling the interior 160 with regard to the exterior 162 of the electronic device 100 in the shown assembly state. According to FIG. 1, the sealing 158 forms an integral part of the elastic package housing 156 rather than being provided as a separate body. In other words, sealing 158 and the rest of the package 150 may be handled together and form a one-piece body.

The electronic device 100 furthermore comprises a mounting base 106, here embodied as printed circuit board (PCB). The mounting base 106 and the carrier 152 of the package 150 (with its transducer 154) are electrically connected by a solder bond 180 electrically and mechanically connecting pads 182 of the mounting base 106 with pads 184 of the carrier 152 Vias 186 extending through the carrier 152, lands 188 on top of the vias 186 and bond wires 166 complete the electric coupling path from the mounting base 106 with the transducer 154. According to FIG. 1, the carrier 152 is embodied as a further printed circuit board (PCB).

The transducer 154 mounted on the carrier 152 is configured for converting a package-external pressure (propagating to the transducer 154 via the port 104 and via the elastic encapsulant 164) into an electric signal being indicative of the pressure value to be sensed. For that purpose, the transducer 154 comprises a MEMS sensor chip 190 operating as a pressure sensitive element and being controlled by a control chip 192, for instance capable of processing sensor signals sensed by the sensor chip 190. In the shown embodiment, the sensor chip 190 is mounted on top of the control chip 192 and is connected to the latter by a bond wire 166.

The package 150 has a package housing 156 (composed of the sealing 158 and the encapsulant 164 integrally connected therewith) covering part of the carrier 152 and housing the transducer 154. The package housing 156 comprises dispensed gel-type encapsulant 164 encapsulating the transducer 154 and covering part of the carrier 152 and being laterally surrounded and delimited by the sealing 158. Also the sealing 158 may be formed by dispensing, or by molding, etc. As can be taken from FIG. 1 and FIG. 2, the sealing 158 extends beyond edges of the transducer 154 and even of the encapsulant 164 both in a vertical direction and in a horizontal direction.

FIG. 1 therefore shows the electronic device 100 with premolded package 150 mounted therein, wherein the liquid-tight sealing between package 150 and cover 102 of the electronic device 100 is accomplished by integrated sealing 158 forming part of a package housing 156 of the package 150. Thus, a sensor assembly with an integrated sealing function contributed by the package housing 156 of package 150 is provided. Therefore, a separate sealing element provided apart from the package 150 is dispensable, which simplifies handling during a manufacturing procedure of the electronic device 100. Furthermore, such an integrated sealing 158 forming part of a transducer package housing 156 provides for a highly compact configuration and delimits the volume in which the soft encapsulant 164 can be formed by dispensing and curing. FIG. 1 therefore shows an elastic cavity package 150 which offers an integrated sealing function. The through hole-type port 104 in the device casing 102 serves as a pressure access for providing a pressure coupling between the interior 160 and the exterior 162 of the electronic device 100. Mounting base 106 relates to a second level PCB. Carrier 152 may be a multi-layer substrate or a lead frame and may carry the controller chip 192.

FIG. 2 shows a top view of the arrangement according to FIG. 1 and in particular shows the integrated sealing 158 embodied as a circumferentially closed annular structure.

According to FIG. 1 and FIG. 2, the sealing 158 is adhesively joint and is in material engagement with a rest of the package housing 156 so that the sealing section and the encapsulation section of the package housing 156 form an integrally connected and intrinsically adhering common structure. The sealing 158 forms part of an exterior surface of the package housing 156 and is therefore enabled to provide a package-external sealing function rather than only a package-internal sealing function. This sealing function is accomplished according to FIG. 1 by pressing the sealing 158 between the device casing 102 and the carrier 152 of the package 150.

According to FIG. 1 and FIG. 2, the sealing 158 laterally delimits the elastic gel-type encapsulant 164, therefore fulfils also a package housing function and consequently forms part of the package housing 156.

For manufacturing the electronic device 100 according to FIG. 1 and FIG. 2, the sealing 158 may be formed before dispensing the gel material constituting the encapsulant 164. The semiconductor chips constituting the transducer 154 may be mounted on the carrier 152 and on one another, respectively, before or after connecting the sealing 158 on the carrier 152.

Various manufacturing procedures are possible for the sealing 158. In one embodiment, the sealing 158 may be manufactured by dispensing (and, if desired or required, curing) elastic sealing material (for instance silicone) on the carrier 152. In another embodiment, the sealing 158 may be formed by molding, for instance injection molding. It is also possible to manufacture the sealing 158 by vulcanizing. Furthermore, it is also possible to pick and place a previously manufactured sealing 158 on the carrier 152 and immobilize it there. In such an embodiment, integrated connection between sealing 158 and carrier 152 may be accomplished by gluing or a form closure (for instance by locking the sealing 158 into an inverse shaped recess in the carrier 152).

Figure 3:
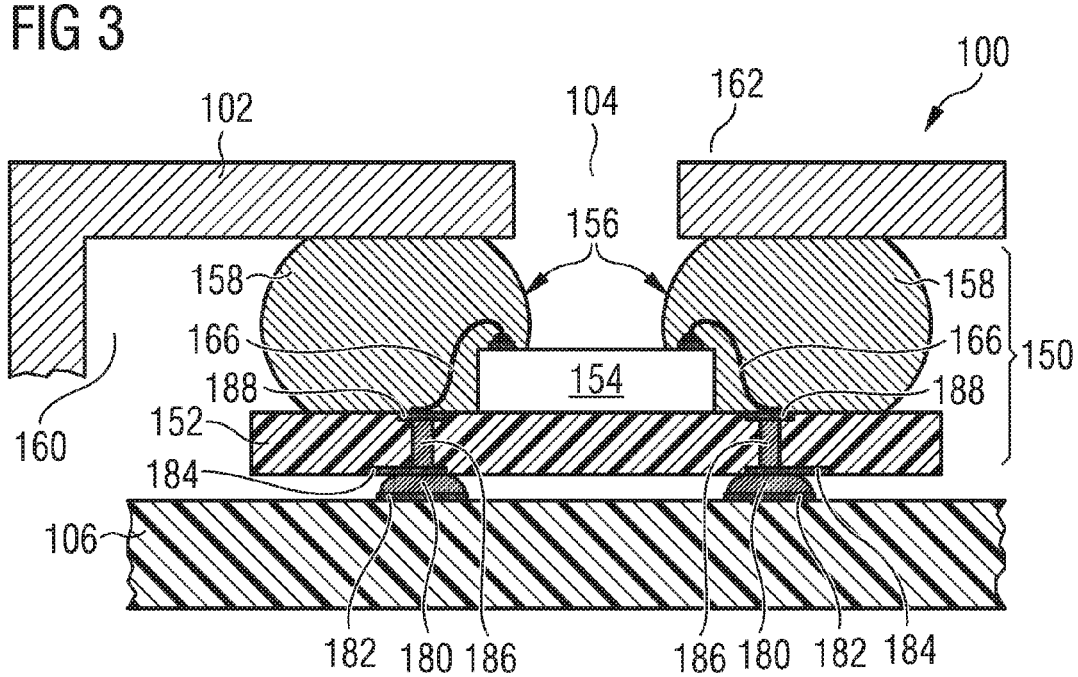
FIG. 3 illustrates a cross-section of an electronic device according to another exemplary embodiment.

FIG. 3 illustrates a cross-section of an electronic device 100 with a mold-over-chip package 150 according to another exemplary embodiment.

According to FIG. 3, the entire package housing 156 consists of the sealing 158 or is identical with the sealing 158.

Electric coupling elements, which are here embodied as bond wires 166, are configured for electrically coupling the transducer 154 with the carrier 152 and here extend completely within the sealing 158.

In FIG. 3, the functions of the sensor chip 190 and the control chip 192 are all fulfilled by a single semiconductor chip (see reference numeral 154). The package 150 of FIG. 3 may provide a pressure sensor or microphone functionality.

The embodiment shown in FIG. 3 relates to an elastic cavity package 150 which also offers an integrated sealing function. FIG. 3 relates to the architecture of a molded package (in a mold over chip configuration). In this embodiment, the integrated sealing 158 forms the entire package housing 156 of the package 150 and also provides for an encapsulation of the mechanically sensitive bond wires 166.

According to FIG. 3, the sealing 158 encapsulates part of the transducer 154 and fully encapsulates the bond wires 166, therefore fulfils a package housing function and consequently forms part of the package housing 156.

Figure 4:
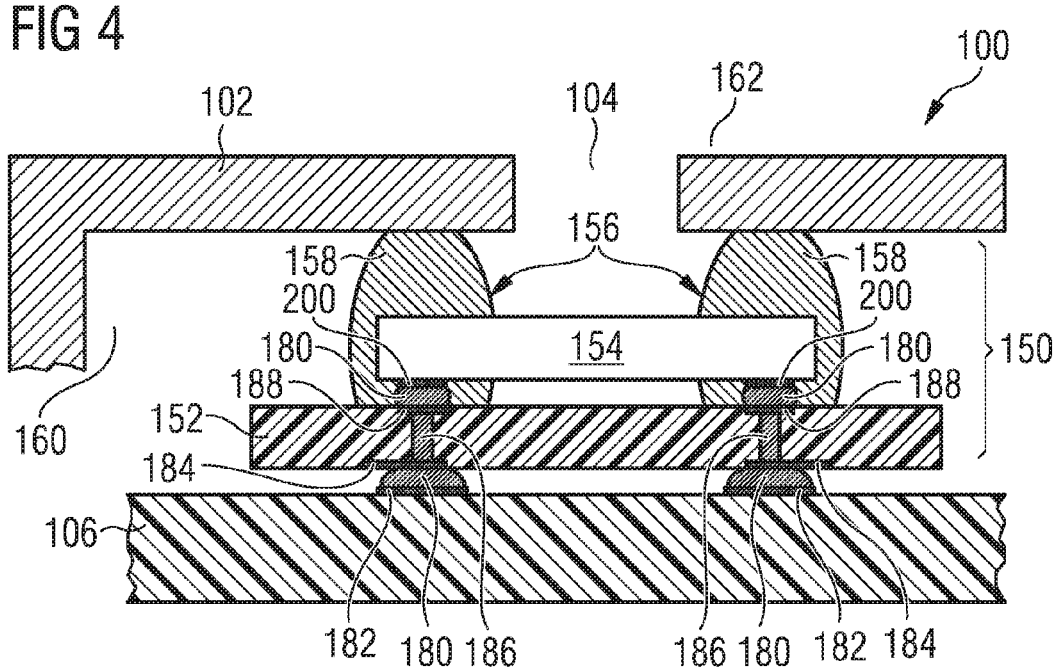
FIG. 4 illustrates a cross-section of an electronic device according to still another exemplary embodiment.

FIG. 4 illustrates a cross-section of an electronic device 100 according to still another exemplary embodiment.

The electronic device 100 according to FIG. 4 differs from the electronic device 100 according to FIG. 3 in that the bond wire connection between the transducer 154 and the carrier 152 is substituted by a solder connection, wherein the transducer 154 is arranged in a flip chip configuration according to FIG. 4. Correspondingly, the package 150 of the electronic device 100 of FIG. 4 is embodied in Wafer Level Ball Grid Array (WLB) architecture. Pads 200 of the transducer 154 are connected with the lands 188 on top of the carrier 152 by further solder bonds 180. Solder balls may be already formed on wafer level before singularization. Connection with the PCB type carrier 152 may then be accomplished by soldering in a reflow oven or the like.

According to FIG. 4, the sealing 158 encapsulates part of the transducer 154 and encapsulates the elements 180, 188, 200 of the solder connection, therefore fulfils a package housing function and consequently forms part of the package housing 156.

Concluding, exemplary embodiments of the invention provide a sensor (such as a pressure sensor, gas sensor, optical sensor, radar sensor or a camera) comprising chips on a multi-layer substrate or a lead frame, housed in an elastic cavity package and covered with a cover being part of a second level system (i.e. an electronic device). For instance, the cover may the cover of an electronic user appliance such as a mobile phone, or of a supersystem.

Particularly advantageously, the sealing may be already the sensor package housing itself, or part thereof. In other words, such a package offers besides the housing function additionally already the sealing function. In an embodiment, the device casing of the electronic device may form part of the package.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:
    a carrier;
    a transducer mounted on the carrier and configured for converting between a package-external property and an electric signal;
    a package housing at least partially housing at least one of the carrier and the transducer; and
    a sealing for sealing between the package and a package-external body;
    wherein the sealing forms at least part of the package housing and the package housing comprises or consists of an elastic material,
    wherein the sealing is configured for fluidically decoupling an interior with regard to an exterior of an electronic device when the package is mounted in the electronic device,
    wherein the sealing extends beyond an edge of the transducer in at least one of a vertical direction and a lateral direction.

2. The package according to claim 1, wherein the package housing consists of the sealing.

3. The package according to claim 1, wherein the package housing comprises an encapsulant encapsulating at least part of at least one of the transducer and the carrier and being surrounded, in particular circumferentially delimited, by the sealing.

4. The package according to claim 1, wherein the sealing has an annular shape.

5. The package according to claim 1, configured as one of a premolded package, a mold-over-chip package, and a Wafer Level Ball Grid Array package.

6. The package according to claim 1, comprising an electric coupling element, in particular at least one of a bond wire and a solder connection, configured for electrically coupling the transducer with the carrier and extending at least partially within the sealing.

7. The package according to claim 1, wherein the sealing forms at least part of an exterior surface of the package housing.

8. An electronic device, comprising:
    a device casing having a port;
    a package according to claim 1 comprising a transducer and a package-integrated sealing;
    comprising a mounting base on which a carrier of the package is mounted;
    wherein the package is mounted in the device casing so that the transducer is coupled with an exterior of the device casing via the port and so that the sealing fluidically decouples an interior of the device casing from the port.

9. The electronic device according to claim 8, wherein the port is a through hole in the device casing.

10. The electronic device according to claim 8, wherein the electronic device is configured as one of the group consisting of a portable user equipment, a mobile phone, a smart phone, a watch, and a tablet.

11. The electronic device according to claim 8, wherein the mounting base is electrically connected with the carrier.

12. The electronic device according to claim 8, wherein the sealing is configured for sealing by being pressed between the device casing and a carrier of the package.

13. A method of manufacturing a package, the method comprising:
    providing a transducer configured for converting between a package-external property and an electric signal;
    at least partially housing the transducer by a package housing comprising or consisting of an elastic material; and
    forming a sealing as at least part of the package housing for sealing between the package and a package-external body, wherein the sealing extends beyond an edge of the transducer in at least one of a vertical direction and a lateral direction and wherein the sealing is configured for fluidically decoupling an interior with regard to an exterior of an electronic device when the package is mounted in the electronic device.

14. The method according to claim 13, wherein the sealing is provided by one of the group consisting of molding, dispensing, vulcanizing, and pick-and-place assembling.

* * * * *